(12) United States Patent
Chang et al.

(10) Patent No.: US 11,013,131 B2
(45) Date of Patent: May 18, 2021

(54) SHIELDING COVER

(71) Applicant: Wistron NeWeb Corp., Hsinchu (TW)

(72) Inventors: Jen-Yung Chang, Hsinchu (TW); Tiao-Ming Hsu, Hsinchu (TW)

(73) Assignee: WISTRON NEWEB CORP., Hsinchu (TW)

(*) Notice: Subject to any disclaimer, the term of this patent is extended or adjusted under 35 U.S.C. 154(b) by 104 days.

(21) Appl. No.: 16/663,550

(22) Filed: Oct. 25, 2019

(65) Prior Publication Data
US 2020/0253066 A1 Aug. 6, 2020

(30) Foreign Application Priority Data

Feb. 1, 2019 (TW) ................... 108103970

(51) Int. Cl.
| | | |
|---|---|---|
| *H05K 5/00* | (2006.01) | |
| *G02B 7/00* | (2021.01) | |
| *H05K 1/18* | (2006.01) | |
| *H05K 1/14* | (2006.01) | |

(52) U.S. Cl.
CPC ........... *H05K 5/0026* (2013.01); *G02B 7/008* (2013.01); *H05K 1/147* (2013.01); *H05K 1/189* (2013.01)

(58) Field of Classification Search
CPC ...... H05K 5/0026; H05K 1/147; H05K 1/189; G02B 7/008
See application file for complete search history.

(56) References Cited

U.S. PATENT DOCUMENTS

| | | | |
|---|---|---|---|
| 10,349,566 B1* | 7/2019 | Chang | H05K 9/0032 |
| 2008/0080160 A1* | 4/2008 | English | H05K 9/0032 361/818 |
| 2012/0008302 A1* | 1/2012 | Lin | H05K 9/0026 361/818 |
| 2013/0033843 A1* | 2/2013 | Crotty, Jr. | H05K 9/0032 361/807 |
| 2020/0253066 A1* | 8/2020 | Chang | G02B 7/008 |

FOREIGN PATENT DOCUMENTS

TW    M541702 U    5/2017

\* cited by examiner

*Primary Examiner* — Abdullah A Riyami
*Assistant Examiner* — Nader J Alhawamdeh
(74) *Attorney, Agent, or Firm* — McClure, Qualey & Rodack, LLP

(57) ABSTRACT

A shielding cover is provided. The shielding cover is adapted to be disposed on a circuit board and covers at least one electronic element. The shielding cover includes a cover body and a first spacer. The cover body includes a top sheet and a plurality of sidewalls, wherein a plurality of sidewall connecting portions are formed on the sidewalls. The first spacer includes a first spacer body, a first connection portion and a second connection portion, wherein the first connection portion and the second connection portion are formed on two ends of the first spacer body, and the first connection portion and the second connection portion are detachably connected to the sidewall connecting portions.

18 Claims, 12 Drawing Sheets

SHIELDING COVER

CROSS REFERENCE TO RELATED APPLICATIONS

This Application claims priority of Taiwan Patent Application No. 108103970, filed on Feb. 1, 2019, the entirety of which is incorporated by reference herein.

BACKGROUND OF THE INVENTION

Field of the Invention

The present invention relates to a shielding cover, and in particular to a low-cost shielding cover.

Description of the Related Art

A conventional shielding cover includes a frame and a cover body. The frame is mounted on a circuit board with surface-mount technology (SMT). The frame is integrally formed, which includes a plurality of spacers. The spacers are formed in a punching process. Conventionally, the shielding cover is formed by a mold, and the positions of the spacers are fixed. Therefore, the shielding cover is formed using one single mold that cannot be commonly used for shielding different electronic layout designs.

BRIEF SUMMARY OF THE INVENTION

In one embodiment, a shielding cover is provided. The shielding cover is adapted to be disposed on a circuit board and covers at least one electronic element. The shielding cover includes a cover body and a first spacer. The cover body includes a top sheet and a plurality of sidewalls, wherein a plurality of sidewall connecting portions are formed on the sidewalls. The first spacer includes a first spacer body, a first connection portion and a second connection portion, wherein the first connection portion and the second connection portion are formed on two ends of the first spacer body, and the first connection portion and the second connection portion are detachably connected to the sidewall connecting portions.

In one embodiment, the shielding cover further comprises a second spacer, wherein the second spacer comprises a second spacer body, a third connection portion and a fourth connection portion, the third connection portion and the fourth connection portion are formed on two ends of the second spacer body, the first spacer further comprises at least one first spacing portion, the first spacing portion is connected to the first spacer body, the third connection portion is detachably connected to the first spacing portion, and the fourth connection portion is detachably connected to one of the sidewall connecting portions.

In one embodiment, a shielding cover is provided. The shielding cover is adapted to be disposed on a circuit board and covers at least one electronic element. The shielding cover includes a cover body, a first spacer and a second spacer. The cover body includes a top sheet and a plurality of sidewalls, wherein a plurality of sidewall connecting portions are formed on the sidewalls. The first spacer includes a first spacer body, at least one first spacing portion and a first connection portion, wherein the first connection portion is formed on one end of the first spacer body, the first spacing portion is connected to the first spacer body, and the first connection portion is detachably connected to one of the sidewall connecting portions. The second spacer comprises a second spacer body, a third connection portion and a fourth connection portion, the third connection portion and the fourth connection portion are formed on two ends of the second spacer body, the third connection portion is connected to the first spacing portion, and the fourth connection portion is connected to one of the sidewall connecting portions.

Utilizing the shielding cover of the embodiment of the invention, the number and the position of the first spacer and the second spacer can be modified according to design requirement. The shielding cover of the embodiment can by utilized to different electronic layout designs to provide shielding function. The additional mold cost is omitted, and the manufacturing cost is therefore decreased. In one embodiment, the cover body, the first spacer and the second spacer can be pre-assembled into a shielding cover. The shielding cover is then mounted to the circuit board by surface-mount technology (SMT) or other technology. The shielding cover is therefore can be easily assembled.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
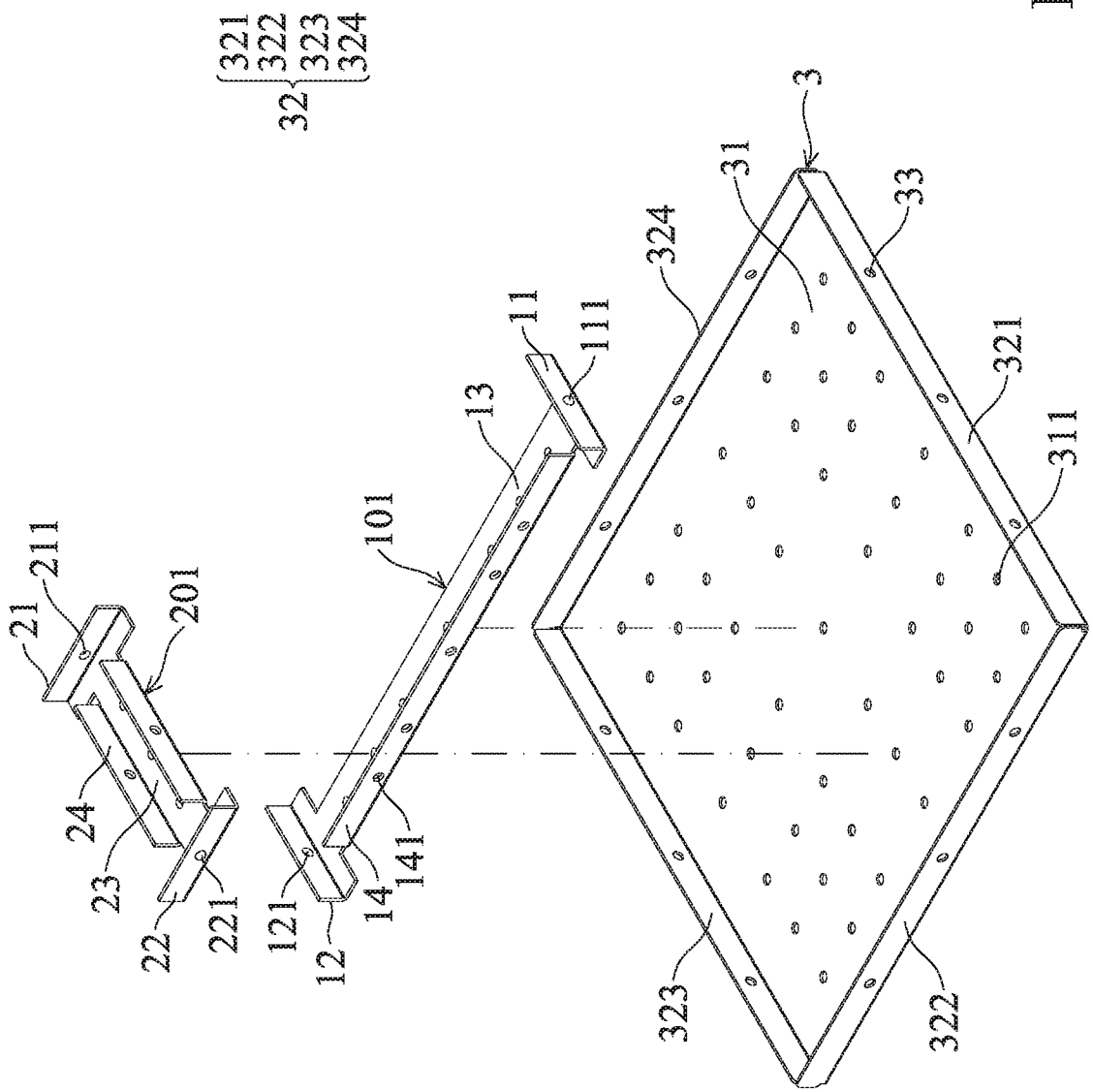
FIG. 1A is an exploded view of a shielding cover of a first embodiment of the invention.
Figure 1B:
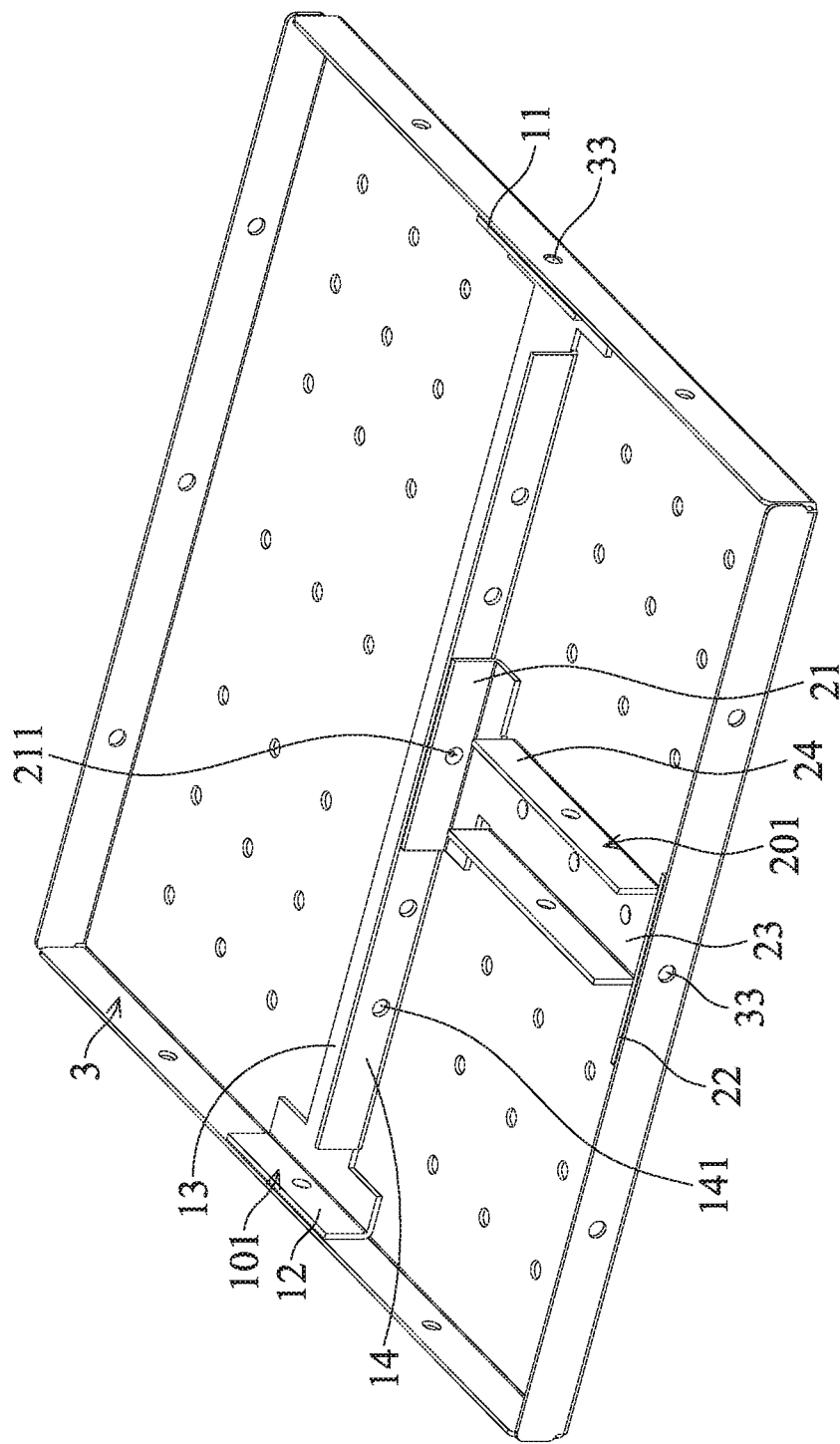
FIG. 1B is an assembled view of the shielding cover of the first embodiment of the invention.

FIG. 1A is an exploded view of a shielding cover C1 of a first embodiment of the invention. FIG. 1B is an assembled view of the shielding cover C1 of the first embodiment of the invention. With reference to FIGS. 1A and 1B, the shielding cover C1 is adapted to be disposed on a circuit board and covers at least one electronic element. The shielding cover C1 includes a cover body 3 and a first spacer 101. The cover body 3 includes a top sheet 31 and a plurality of sidewalls 32. A plurality of sidewall connecting portions 33 are formed on the sidewalls 32. The first spacer 101 includes a first spacer body 13, a first connection portion 11 and a second connection portion 12. The first connection portion 11 and the second connection portion 12 are formed on two ends of the first spacer body 13, and the first connection portion 11 and the second connection portion 12 are detachably connected to the sidewall connecting portions 33.

With reference to FIGS. 1A and 1B, in one embodiment, the shielding cover C1 further comprises a second spacer 201. The second spacer 201 comprises a second spacer body 23, a third connection portion 21 and a fourth connection portion 22. The third connection portion 21 and the fourth connection portion 22 are formed on two ends of the second spacer body 23. The first spacer 101 further comprises at least one first spacing portion 14. The first spacing portion 14 is connected to the first spacer body 13. The third connection portion 21 is detachably connected to the first spacing portion 14. The fourth connection portion 22 is detachably connected to one of the sidewall connecting portions 33.

Figure 2A:
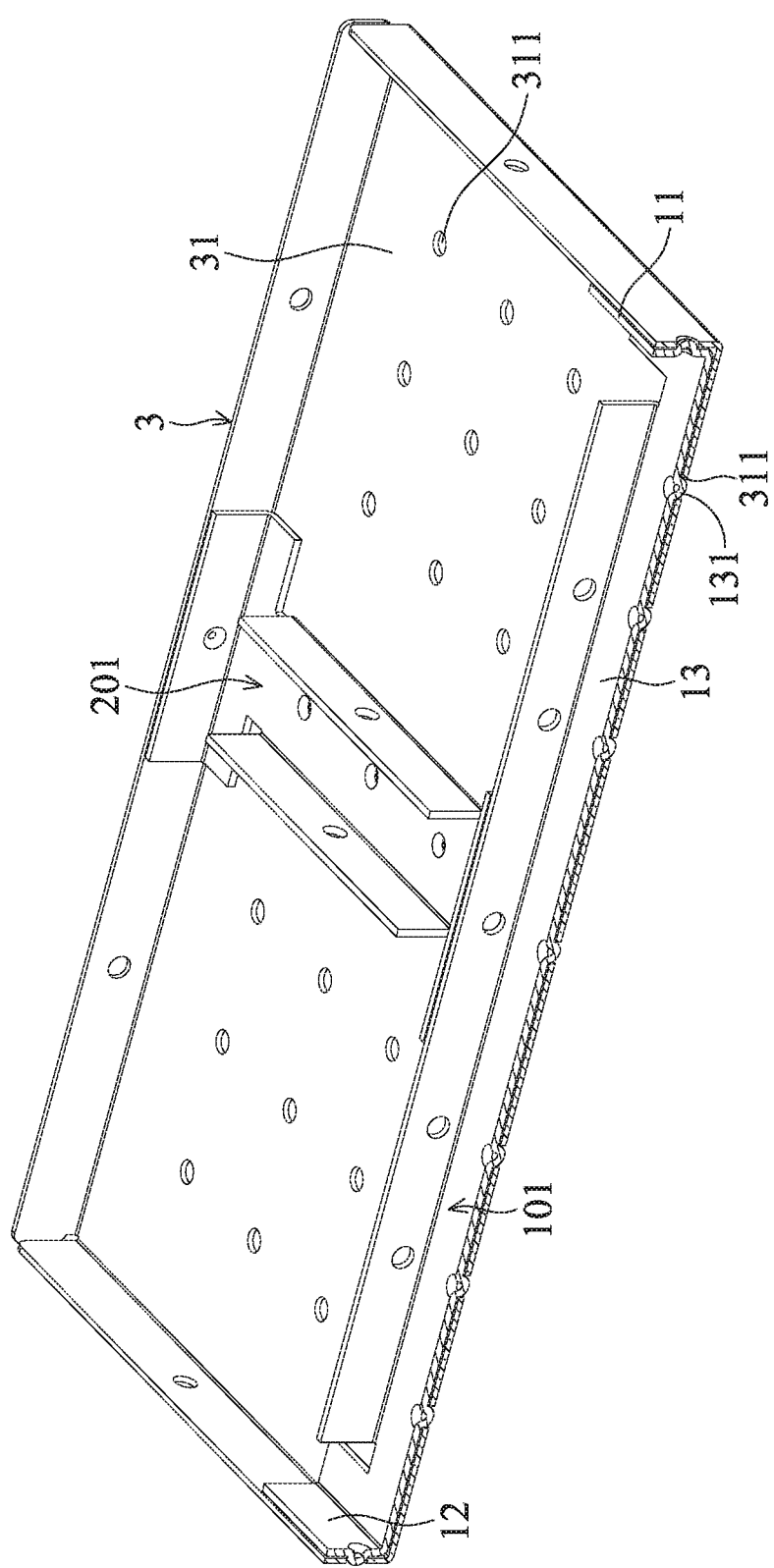
FIG. 2A is a sectional view of a first spacer of the embodiment of the invention.

FIG. 2A is a sectional view of the first spacer 101 of the embodiment of the invention. With reference to FIG. 2A, in one embodiment, the top sheet 31 comprises a plurality of top sheet connecting portions 311. The first spacer body 13 comprises at least one first body connection portion 1131, and the first body connection portion 131 is connected to the top sheet connecting portion 311. It is worth mentioning that, in one embodiment, when the shielding cover C1 is rotated to be combined with the circuit board, the first spacer body 13 may be separated from the top sheet 31 by gravity, the first body connection portion 131 is therefore separated from the top sheet connecting portion 311. However, the first body connection portion 131 is still aligned with the top sheet connecting portion 311.

With reference to FIG. 2A, in one embodiment, the top sheet connecting portions 311 comprise a plurality of top sheet openings, and the first body connection portion 131 comprises a body connection dimple. By the design of connecting (aligned) the first body connection portion 131 to the top sheet connecting portion 311, the first spacer 101 is firmly connected to the cover body 3. However, the disclosure is not meant to restrict the invention. In another embodiment, the first body connection portion 131 can be omitted, and the top sheet openings can be utilized as vent holes.

In another embodiment, the second spacer 201 can also have a second body connection portion. The second body connection portion is connected to (aligned with) the top sheet connecting portions 311, and the second spacer 201 is therefore firmly connected to the cover body 3.

With reference to FIGS. 1A and 1B, in one embodiment, the sidewalls 32 comprise a first sidewall 321, a second sidewall 322, a third sidewall 323 and a fourth sidewall 324. The first sidewall 321 is perpendicular to the second sidewall 322. The first side wall 321 is parallel to the third sidewall 323. The second sidewall 322 is parallel to the fourth sidewall 324. The sidewall connecting portions 33 are formed on the first sidewall, 321 the second sidewall 322, the third sidewall 323 and the fourth sidewall 324. The first connection portion 11 and the second connection portion 12 are respectively connected to the first sidewall 321 and the third sidewall 323. The fourth connection portion 22 is connected to the second sidewall 322.

With reference to FIGS. 1A and 1B, in one embodiment, the first connection portion 11 comprises a first connection element (first connection dimple) 111, the second connection portion 12 comprises a second connection element (second connection dimple) 121, the sidewall connecting portions 33 comprise a plurality of sidewall connecting openings. The first connection element (first connection dimple) 111 and the second connection element (second connection dimple) 121 are connected to the sidewall connecting portions (sidewall connecting openings) 33. The first connection portion 11 and the second connection portion 12 are connected to the openings of the sidewall connecting portions 33 by dimples. However, the disclosure is not meant to restrict the invention. For example, in another embodiment, the first connection portion and the second connection portion can have openings or recess, the sidewall connecting portions can have dimples, and the openings or recess of the first connection portion and the second connection portion can be combined with the dimples of the sidewall connecting portions.

With reference to FIGS. 1A and 1B, in one embodiment, the first connection portion 11 and the second connection portion 12 are perpendicular to the first spacer body 13. With reference to FIG. 2A, the first spacer body 13, the first connection portion 11 and the second connection portion 12 form a U-shaped structure. Therefore, the first spacer 101 has improved strength.

With reference to FIGS. 1A and 1B, in this embodiment, the first spacing portion 14 is formed on one side of the first spacer body 13. The first spacing portion 14 is perpendicular to the first spacer body 13. The first spacing portion 14 comprises at least one first spacer connecting portion (first spacer connecting opening) 141, the third connection portion 21 comprises a third connection element (third connection dimple) 211, and the fourth connection portion 22 comprises a fourth connection element (fourth connection dimple) 221. The third connection element (third connection dimple) 211 is connected with the first spacer connecting portion (first spacer connecting opening) 141, and the fourth connection element (fourth connection dimple) 221 is connected to one of the sidewall connecting portions (sidewall connecting openings) 33. The third connection portion 21 and the fourth connection portion 22 are connected to the openings of the first spacing portion 14 by dimples. However, the disclosure is not meant to restrict the invention. For example, in another embodiment, the third connection portion and the fourth connection portion can have openings or recess, the first spacing portion 14 can have dimples, and the openings or recess of the third connection portion and the fourth connection portion can be combined with the dimples of the first spacing portion.

Figure 2B:
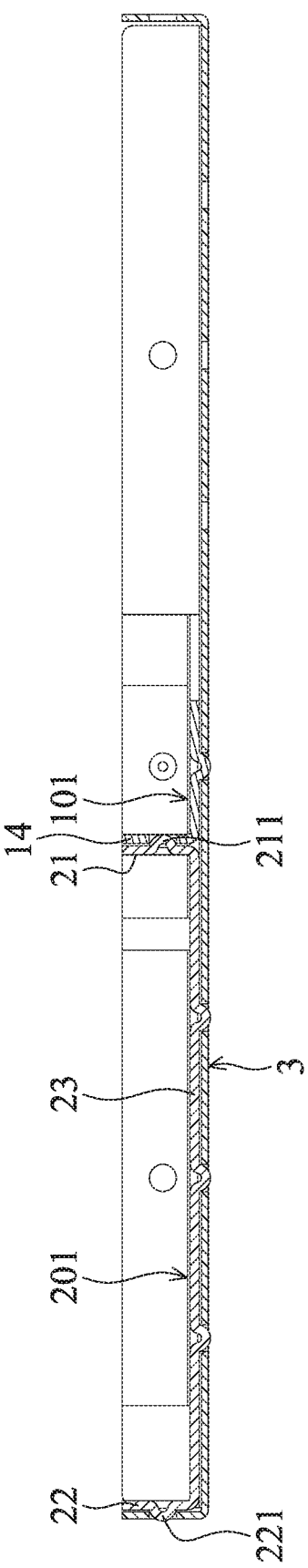
FIG. 2B is a sectional view of a second spacer of the embodiment of the invention.

FIG. 2B is a sectional view of the second spacer 201 of the embodiment of the invention. With reference to FIG. 2B, in one embodiment, the second spacer body 23, the third connection portion 21 and the fourth connection portion 22 form a U-shaped structure. Therefore, the second spacer 201 has improved strength.

Figure 3:
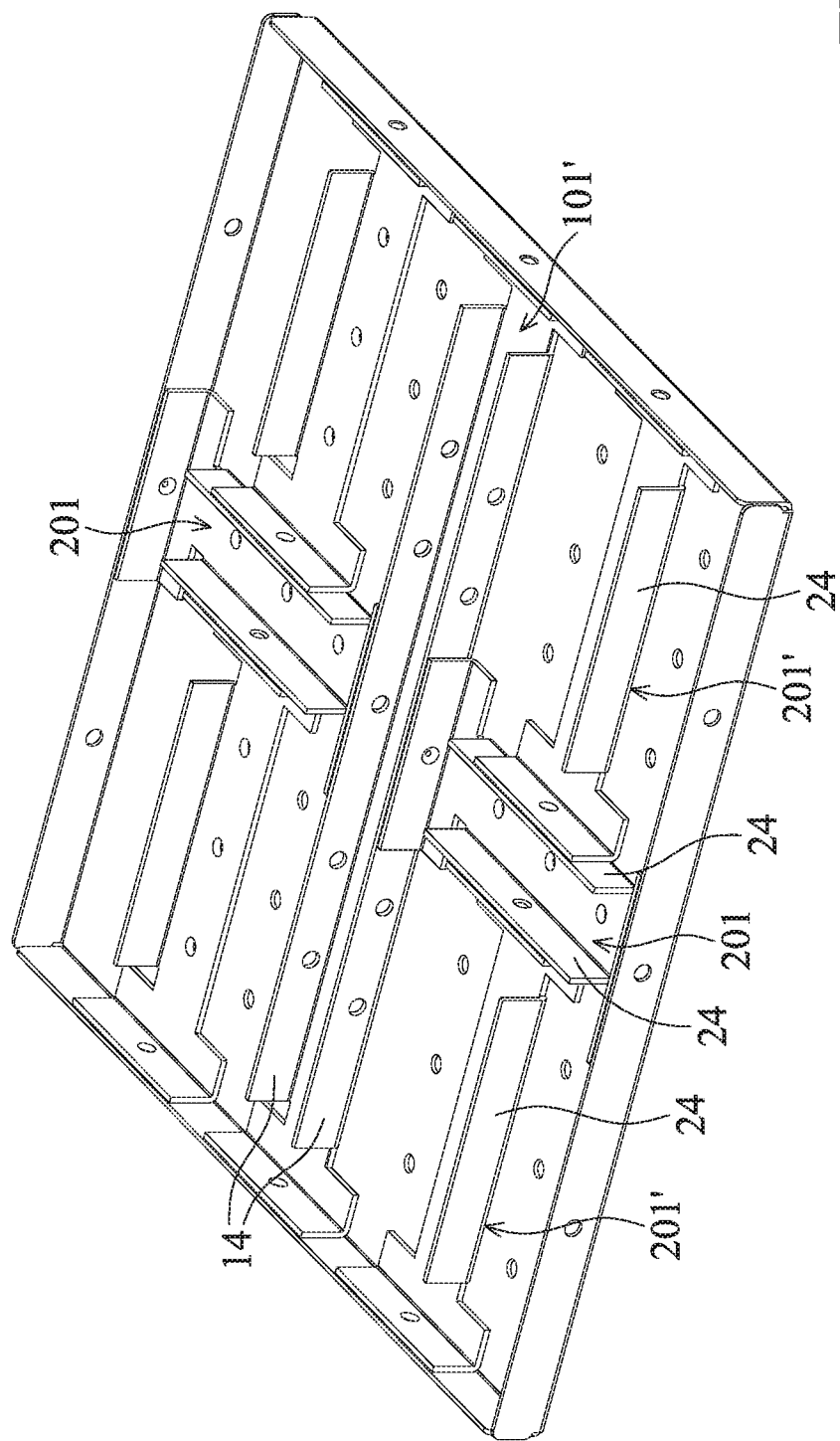
FIG. 3 shows a shielding cover of a modified example of the first embodiment of the invention.

With reference to FIG. 3, in one embodiment, the first spacer 101' includes two first spacing portions 14, the first spacing portions 14 are connected to two sides of the first spacer body 13. Therefore, at least two second spacer 201 can be connected to the two sides of the first spacer 101'. Additionally, the second spacer 201 can also have a second spacing portion 24. The second spacing portion 24 is connected with other second spacers. Similarly, the second spacer can have one second spacing portion 24 (the second spacing portion 201' as shown in FIG. 3) or, have two second spacing portions 24 (the second spacing portion 201 as shown in FIG. 3).

Figure 4:
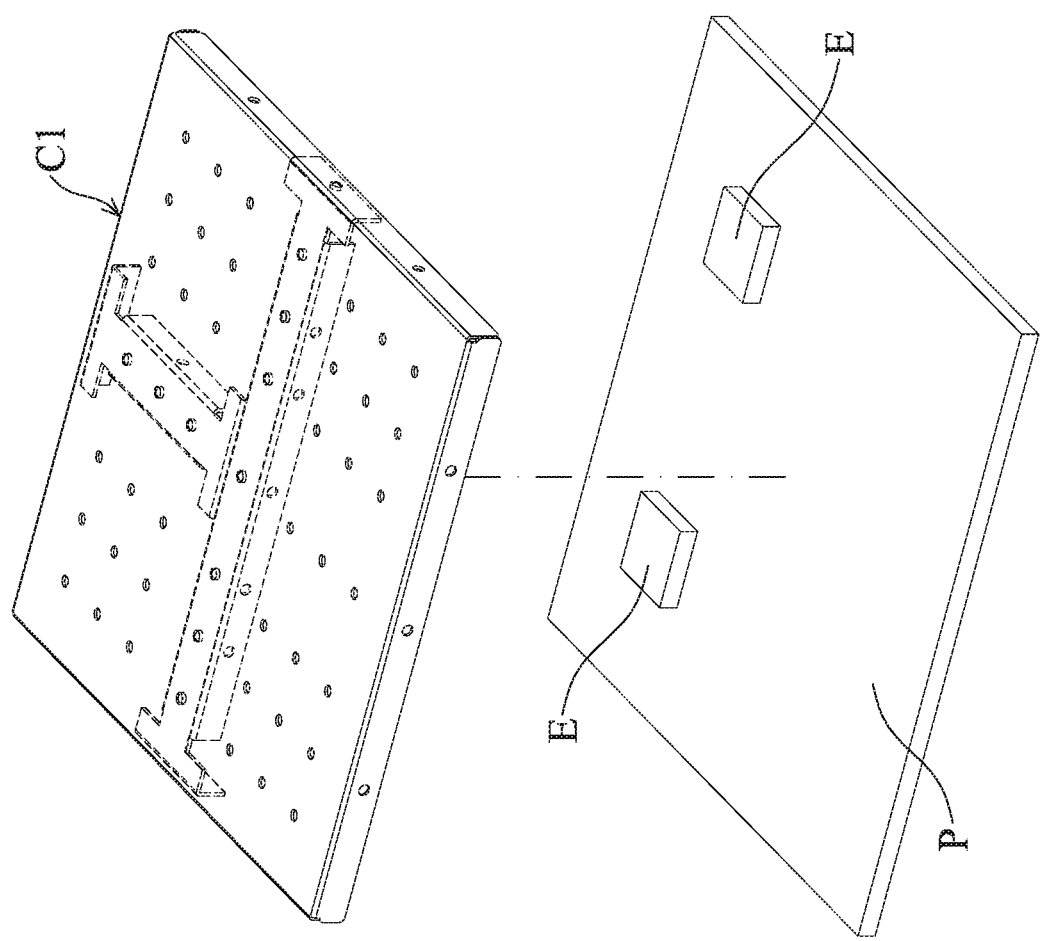
FIG. 4 shows the shielding cover of the first embodiment of the invention connected to a circuit board.

With reference to FIG. 4, utilizing the shielding cover C1 of the embodiment of the invention, the first spacer 101 and the second spacer 201 can be pre-assembled to the cover body 3. Then, the shielding cover C1 is welded to the circuit board P to cover the electronic element E on the circuit board P.

Figure 5:
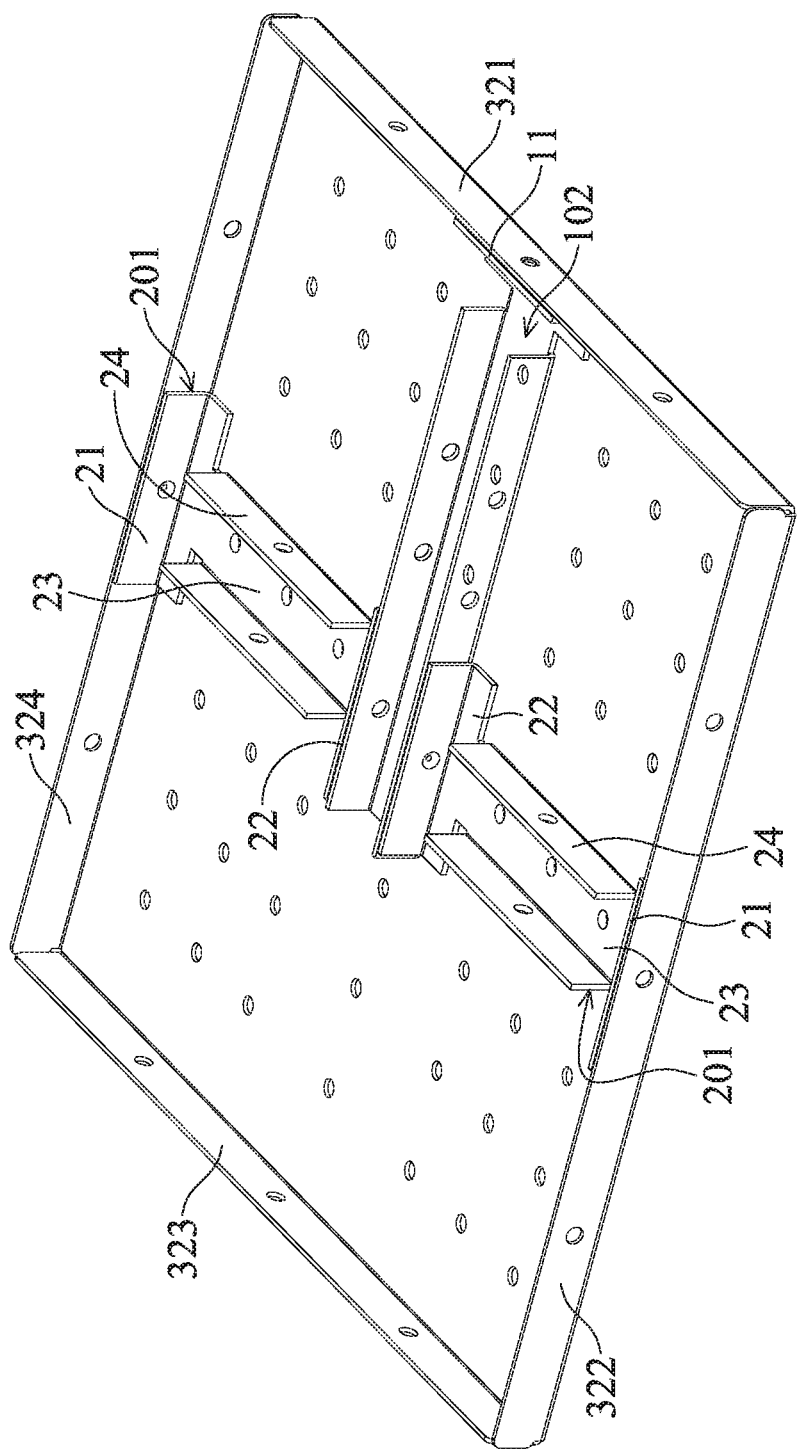
FIG. 5 shows another shielding cover of another modified example of the first embodiment of the invention.

With reference to FIG. 5, in another embodiment, the first spacer 102 may have no second connection portion. The two sides of the first spacer 102 are connected to the second spacer 201. The first spacer 102 is connected to the first sidewall 321 via the first connection portion 11. The first spacer 102 and the second spacers 201 connected to the two sides thereof form a firmly connected structure. The disclosure is not meant to restrict the invention.

Figure 6A:
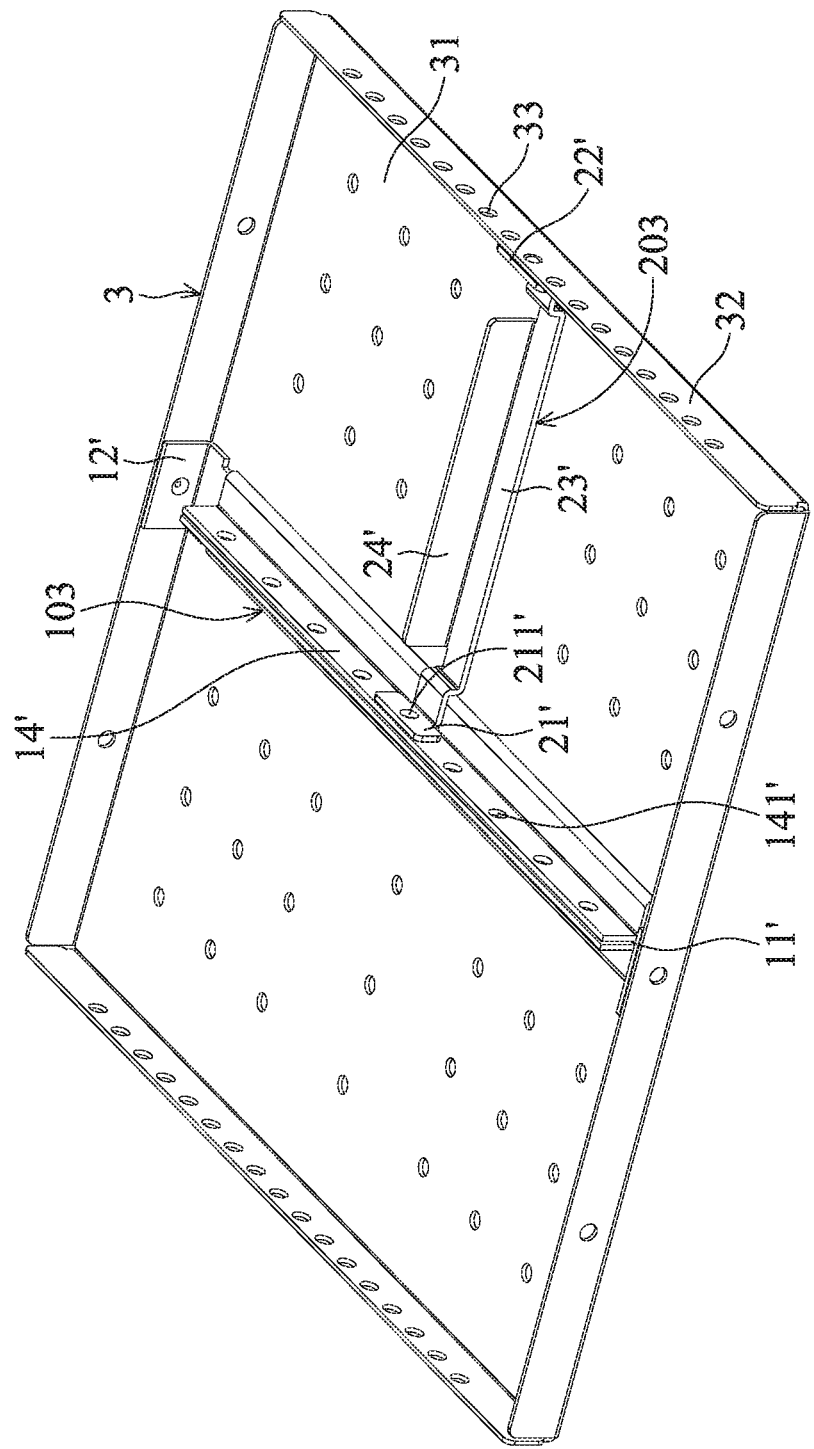
FIG. 6A is an assembled view of a shielding cover of a second embodiment of the invention.
Figure 6B:
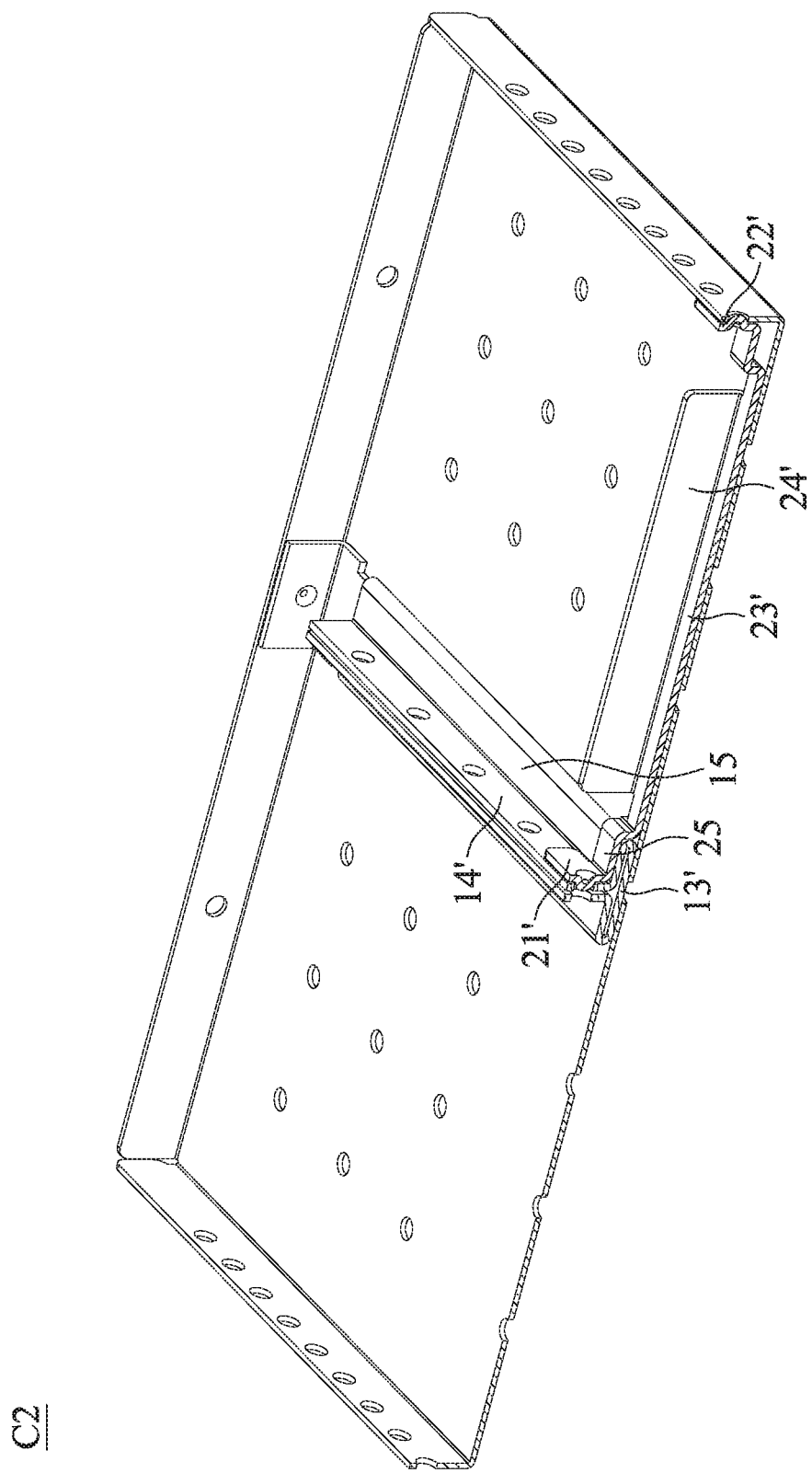
FIG. 6B is a sectional view of the shielding cover of the second embodiment of the invention.

FIG. 6A is an assembled view of a shielding cover C2 of a second embodiment of the invention. FIG. 6B is a sectional view of the shielding cover C2 of the second embodiment of the invention. With reference to FIGS. 6A and 6B, the shielding cover C2 includes a cover body 3 and a first spacer 103. The cover body 3 includes a top sheet 31 and a plurality of sidewalls 32. A plurality of sidewall connecting portions 33 are formed on the sidewalls 32. The first spacer 103 includes a first spacer body 13', a first connection portion 11' and a second connection portion 12'. The first connection portion 11' and the second connection portion 12' are formed on two ends of the first spacer body 13'. The first connection portion 11' and the second connection portion 12' are detachably connected to the sidewall connecting portions 33. The shielding cover C2 further comprises a second spacer 203. The second spacer 203 comprises a second spacer body 23', a third connection portion 21' and a fourth connection portion 22'. The third connection portion 21' and the fourth connection portion 22' are formed on two ends of the second spacer body 23'. The first spacer 103 further comprises at least one first spacing portion 14'. The first spacing portion 14' is connected to the first spacer body 13'. The third connection portion 21' is detachably connected to the first spacing portion 14'. The fourth connection portion 22' is detachably connected to one of the sidewall connecting portions 33.

With reference to FIGS. 6A and 6B, in this embodiment, the first spacing portion 14' comprises at least one first spacer connecting portion (first spacer connecting opening) 141', the third connection portion 21' comprises a third connection element (third connection dimple) 211', and the fourth connection portion 22' comprises a fourth connection element (fourth connection dimple, not shown). The third connection element (third connection dimple) 211' is connected with the first spacer connecting portion (first spacer connecting opening) 141', and the fourth connection element (fourth connection dimple) is connected to one of the sidewall connecting portions (sidewall connecting openings) 33. In one embodiment, the third connection portion 21' and the fourth connection portion 22' are connected to the openings of the first spacing portion 14' by dimples. However, the disclosure is not meant to restrict the invention. For example, in another embodiment, the third connection portion and the fourth connection portion can have openings or recess, the first spacing portion can have dimples, and the openings or recess of the third connection portion and the fourth connection portion can be combined with the dimples of the first spacing portion.

With reference to FIGS. 6A and 6B, the second spacer 203 comprises at least one second spacing portion 24'. The second spacing portion 24' is perpendicular to the second spacer body 23' to provide spacing function.

With reference to FIGS. 6A and 6B, in this embodiment, the first spacer 103 further comprises at least one folding portion 15. The first spacing portion 14' connects one side of the folding portion 15. The first spacer body 13' is connected to the other side of the folding portion 15. At least a portion of the folding portion 15 is parallel to the first spacer body 13'. Utilizing the design of the folding portion 15, the first spacing portion 14' is located in the middle of the first spacer body 13, and the space inside the shielding cover C2 can be sufficiently used. In this embodiment, the first spacer 103 has two folding portions 15 and two first spacing portions 14'. The first spacing portions 14' can be adjacent or abut each other, and the space inside the shielding cover C2 is therefore efficiently used.

Figure 6C:
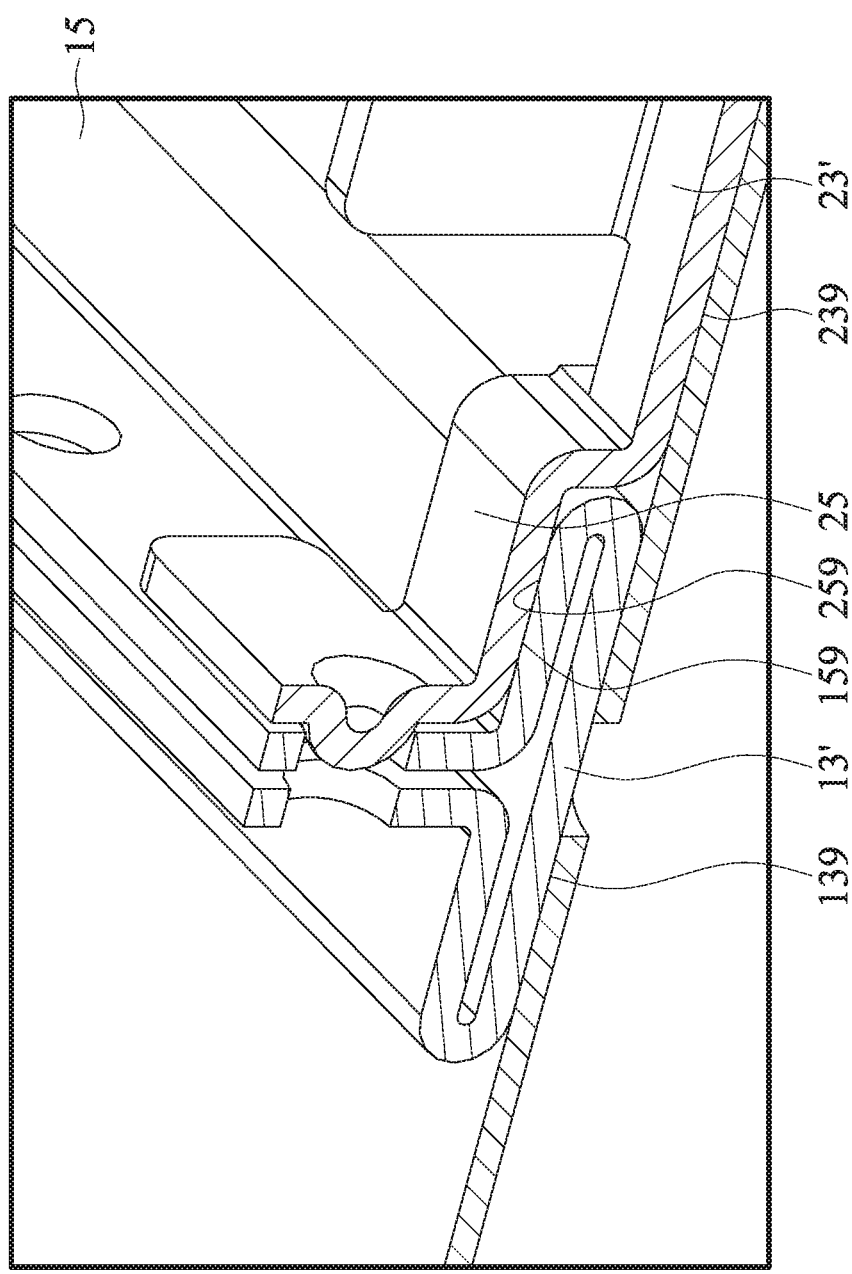
FIG. 6C shows a portion of the shielding cover of the second embodiment of the invention.

With reference to FIGS. 6A and 6B, in one embodiment, the second spacer 203 further comprises at least one bending portion 25. The second spacer body 23' is connected to one end of the bending portion 25. The third connection portion 21' is connected to the other end of the bending portion 25. With reference to FIG. 6C, in one embodiment, the gap between the bottom 259 of the bending portion 25 and the bottom 239 of the second spacer body 23' is greater than the gap between the top 159 of the folding portion 15 and the bottom 139 of the first spacer body 13'. Therefore, the second spacer 203 can be sufficiently combined with the first spacer 103 and the cover body 3.

Figure 7A:
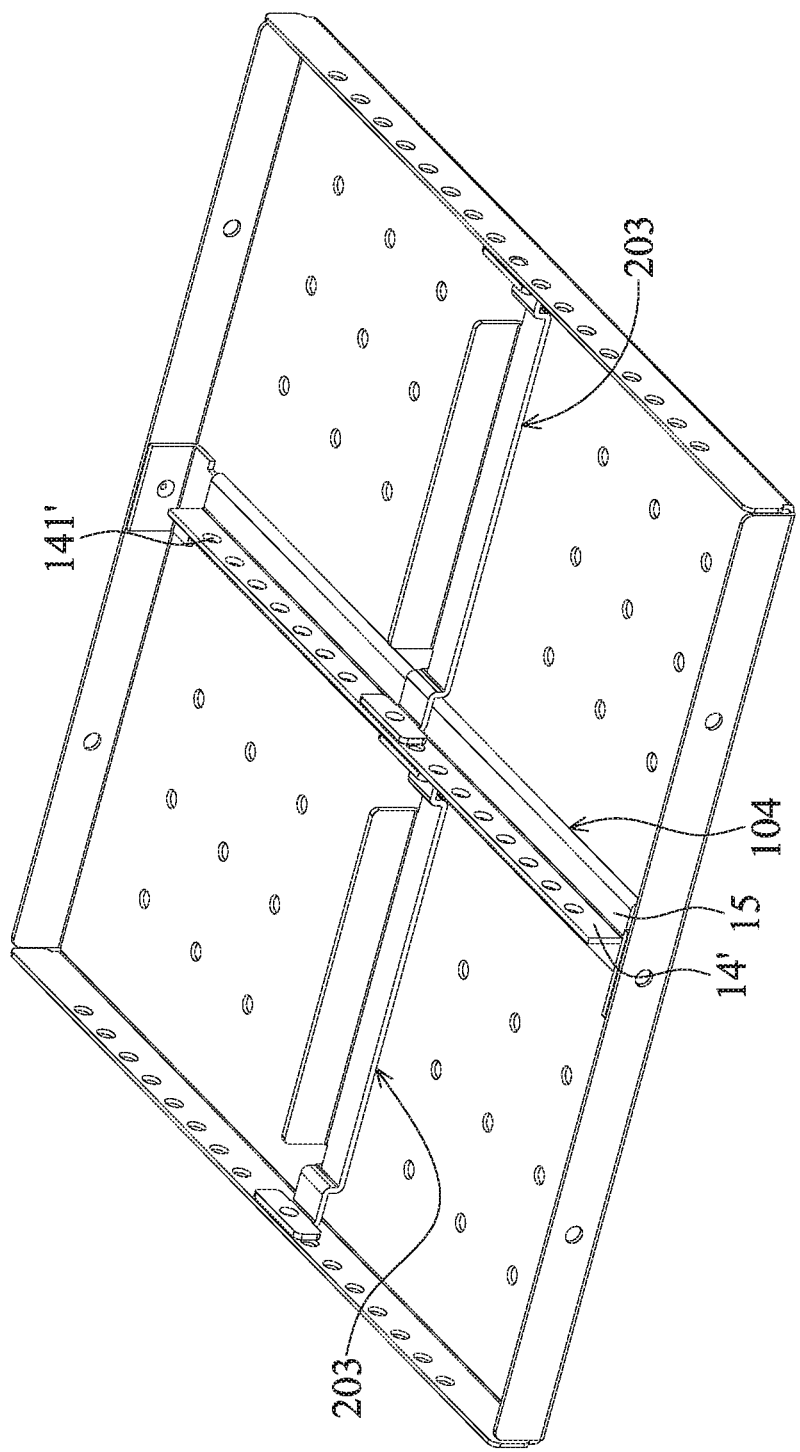
FIG. 7A shows a shielding cover of a modified example of the second embodiment of the invention.
Figure 7B:
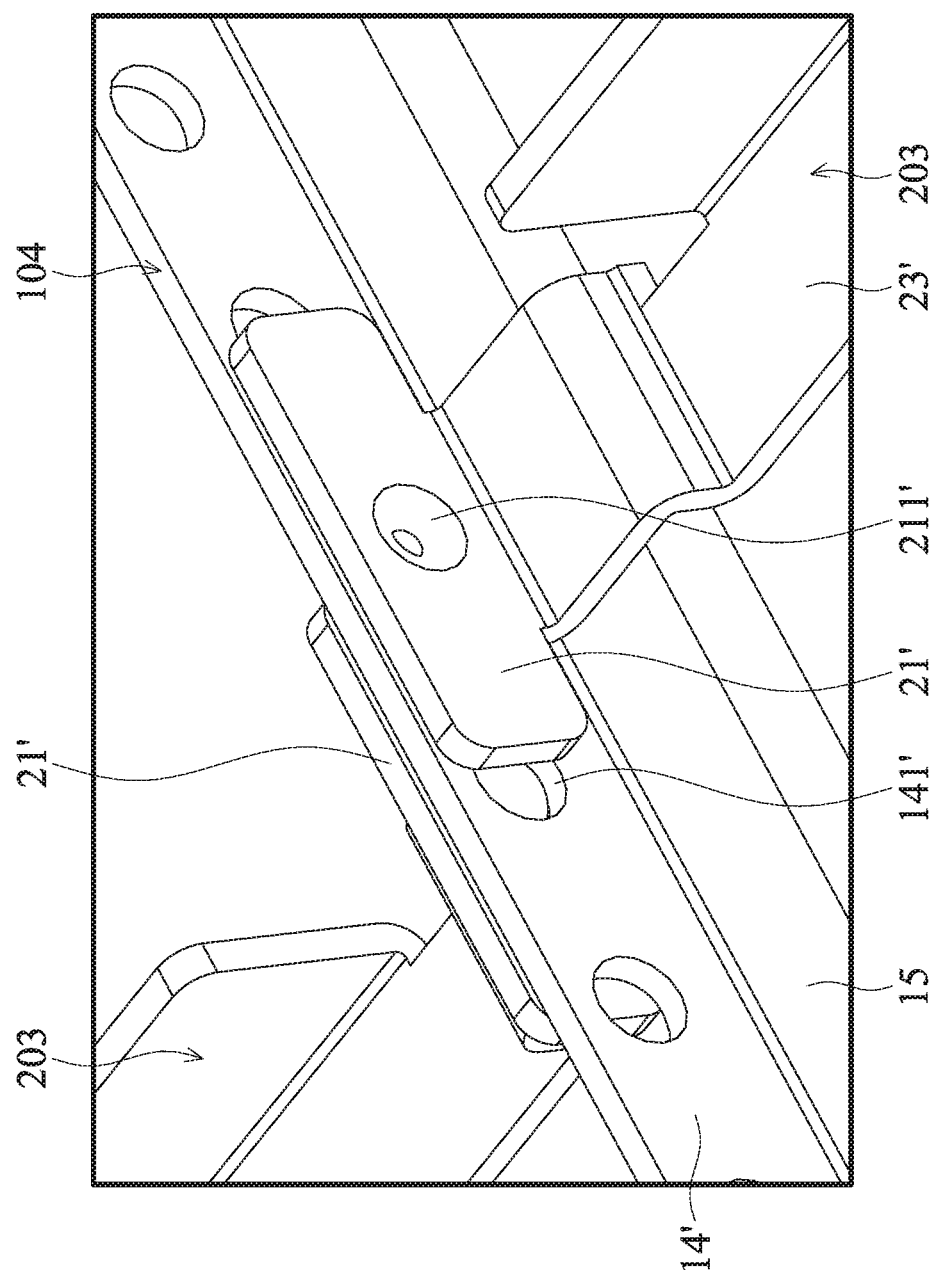
FIG. 7B shows the details of the embodiment of FIG. 7A.

With reference to FIGS. 7A and 7B, in another embodiment, the first spacer 104 includes only one single first spacing portion 14' and one single folding portion 15. The second spacers 203 on two sides of the first spacer 104 are respectively connected to the different first spacer connecting openings 141' on the first spacing portion 14'. In other words, the second spacers 203 on two sides of the first spacer 104 are staggered arranged.

Utilizing the shielding cover of the embodiment of the invention, the number and the position of the first spacer and the second spacer can be modified according to design requirement. The shielding cover of the embodiment can by utilized to different electronic layout design to provide shielding function. The additional mold cost is omitted, and the manufacturing cost is therefore decreased. In one embodiment, the cover body, the first spacer and the second spacer can be pre-assembled into a shielding cover. The shielding cover is then mounted to the circuit board by surface-mount technology (SMT) or other technology. The shielding cover is therefore can be easily assembled.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A shielding cover, adapted to be disposed on a circuit board and covering at least one electronic element, comprising:
   a cover body, comprising a top sheet and a plurality of sidewalls, wherein a plurality of sidewall connecting portions are formed on the sidewalls; and
   a first spacer, comprising a first spacer body, a first connection portion and a second connection portion, wherein the first connection portion and the second connection portion are formed on two ends of the first spacer body, and the first connection portion and the second connection portion are detachably connected to the sidewall connecting portions.

2. The shielding cover as claimed in claim 1, further comprising a second spacer, wherein the second spacer comprises a second spacer body, a third connection portion and a fourth connection portion, the third connection portion and the fourth connection portion are formed on two ends of the second spacer body, the first spacer further comprises at least one first spacing portion, the first spacing portion is connected to the first spacer body, the third connection portion is detachably connected to the first spacing portion, and the fourth connection portion is detachably connected to one of the sidewall connecting portions.

3. The shielding cover as claimed in claim 2, wherein the top sheet comprises a plurality of top sheet connecting portions, the first spacer body comprises at least one first body connection portion, and the first body connection portion corresponds to the top sheet connecting portion.

4. The shielding cover as claimed in claim 3, wherein the top sheet connecting portions comprise a plurality of top sheet openings, and the first body connection portion comprises a body connection dimple.

5. The shielding cover as claimed in claim 2, wherein the sidewalls comprise a first sidewall, a second sidewall, a third sidewall and a fourth sidewall, the first sidewall is perpendicular to the second sidewall, the first side wall is parallel to the third sidewall, the second sidewall is parallel to the fourth sidewall, the sidewall connecting portions are formed on the first sidewall, the second sidewall, the third sidewall and the fourth sidewall, the first connection portion and the second connection portion are respectively connected to the first sidewall and the third sidewall, and the fourth connection portion is connected to the second sidewall.

6. The shielding cover as claimed in claim 2, wherein the first connection portion comprises a first connection element, the second connection portion comprises a second connection element, and the first connection element and the second connection element are aligned with and connected to the sidewall connecting portions.

7. The shielding cover as claimed in claim 2, wherein the first connection portion and the second connection portion are perpendicular to the first spacer body, and the first spacer body, the first connection portion and the second connection portion form a U-shaped structure.

8. The shielding cover as claimed in claim 7, wherein the first spacing portion is perpendicular to the first spacer body, the first spacing portion comprises at least one first spacer connecting portion, the third connection portion comprises a third connection element, the fourth connection portion comprises a fourth connection element, the third connection element is connected with the first spacer connecting portion, and the fourth connection element is connected to one of the sidewall connecting portions.

9. The shielding cover as claimed in claim 8, wherein the third connection element and the fourth connection element each is a dimple, and the first spacer connecting portion and the sidewall connecting portion is each an opening.

10. The shielding cover as claimed in claim 2, wherein the first spacer further comprises at least one folding portion, the first spacing portion connects one side of the folding portion, the first spacer body is connected to the other side of the folding portion, and at least a portion of the folding portion is parallel to the first spacer body.

11. The shielding cover as claimed in claim 10, wherein the second spacer further comprises at least one bending portion, the second spacer body is connected to one end of the bending portion, the third connection portion is connected to the other end of the bending portion, a gap between a bottom of the bending portion and a bottom of the second spacer body is greater than a gap between a top of the folding portion and a bottom of the first spacer body.

12. A shielding cover, adapted to be disposed on a circuit board and covering at least one electronic element, comprising:
   a cover body, comprising a top sheet and a plurality of sidewalls, wherein a plurality of sidewall connecting portions are formed on the sidewalls;
   a first spacer, comprising a first spacer body, at least one first spacing portion and a first connection portion, wherein the first connection portion is formed on one end of the first spacer body, the first spacing portion is connected to the first spacer body, and the first connection portion is detachably connected to one of the sidewall connecting portions; and
   a second spacer, wherein the second spacer comprises a second spacer body, a third connection portion and a fourth connection portion, the third connection portion and the fourth connection portion are formed on two ends of the second spacer body, the third connection portion is connected to the first spacing portion, and the fourth connection portion is connected to one of the sidewall connection portions.

13. The shielding cover as claimed in claim 12, wherein the top sheet comprises a plurality of top sheet connecting portions, the first spacer body comprises at least one first body connection portion, and the first body connection portion corresponds to the top sheet connecting portion.

14. The shielding cover as claimed in claim 13, wherein the top sheet connecting portions comprise a plurality of top sheet openings, and the first body connection portion comprises a body connection dimple.

15. The shielding cover as claimed in claim 14, wherein the first spacing portion is perpendicular to the first spacer body, the first spacing portion comprises at least one first spacer connecting portion, the third connection portion comprises a third connection element, the fourth connection portion comprises a fourth connection element, the third connection element is connected with the first spacer connecting portion, and the fourth connection element is connected to one of the sidewall connecting portions.

16. The shielding cover as claimed in claim 15, wherein the third connection element and the fourth connection element is each a dimple, and the first spacer connecting portion and the sidewall connecting portion is each an opening.

17. The shielding cover as claimed in claim 12, wherein the first spacer further comprises at least one folding portion, the first spacing portion connects one side of the folding portion, the first spacer body is connected to the other side of the folding portion, and at least a portion of the folding portion is parallel to the first spacer body.

18. The shielding cover as claimed in claim 17, wherein the second spacer further comprises at least one bending portion, the second spacer body is connected to one end of the bending portion, the third connection portion is connected to the other end of the bending portion, a gap between a bottom of the bending portion and a bottom of the second spacer body is greater than a gap between a top of the folding portion and a bottom of the first spacer body.

* * * * *